(12) United States Patent
Zhang (10) Patent No.: US 10,998,858 B2
(45) Date of Patent: May 4, 2021

(54) POWER SUPPLY CIRCUIT AND AUDIO PLAY DEVICE

(71) Applicant: Huawei Technologies Co., Ltd., Shenzhen (CN)

(72) Inventor: Xun Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 49 days.

(21) Appl. No.: 16/462,698

(22) PCT Filed: Mar. 9, 2017

(86) PCT No.: PCT/CN2017/076191
§ 371 (c)(1),
(2) Date: May 21, 2019

(87) PCT Pub. No.: WO2018/094910
PCT Pub. Date: May 31, 2018

(65) Prior Publication Data
US 2020/0076371 A1    Mar. 5, 2020

(30) Foreign Application Priority Data

Nov. 22, 2016  (CN) .......................... 201611048663.6

(51) Int. Cl.
*H03F 3/04*    (2006.01)
*H03F 1/02*    (2006.01)
(Continued)

(52) U.S. Cl.
CPC ................. *H03F 1/02* (2013.01); *H03F 3/20* (2013.01); *H04R 3/00* (2013.01); *G05F 1/46* (2013.01); *H02M 3/07* (2013.01); *H03F 2200/03* (2013.01)

(58) Field of Classification Search
CPC ............................... H03F 1/0211; H03F 3/181
(Continued)

(56) References Cited

U.S. PATENT DOCUMENTS

2008/0310046 A1* 12/2008 Menegoli ............... G11B 21/02
                                                                    360/75
2011/0123048 A1    5/2011 Wang et al.
(Continued)

FOREIGN PATENT DOCUMENTS

CN        201039005 Y      3/2008
CN        102075146 A      5/2011
(Continued)

OTHER PUBLICATIONS

Wang, H., "Research on Noise Suppression Techniques of Low Power Audio Subsystem," Doctoral Dissertation Submitted to University of Electronic Science and Technology of China, 2013, 122 pages.
(Continued)

*Primary Examiner* — Steven J Mottola
(74) *Attorney, Agent, or Firm* — Slater Matsil, LLP (57) ABSTRACT

A power supply circuit comprises a power conversion circuit, a voltage selection circuit, and a voltage regulator. The voltage regulator coupled to the voltage selection circuit and a digital-to-analog converter (DAC), and the voltage regulator is configured to provide supply power to the DAC; the power conversion circuit is coupled to a first power supply and a power amplifier (PA), and the power conversion circuit is configured to convert, based on output power of the PA, a voltage of the first power supply into an output voltage that supply power to the PA; and the voltage selection circuit is coupled to a second power supply, the power conversion circuit and the voltage regulator, and the voltage selection circuit is configured to select the second power supply or the
(Continued)

power conversion circuit to supply power to the voltage regulator based on an output voltage of the power conversion circuit.

18 Claims, 7 Drawing Sheets

(51) Int. Cl.
  *H03F 3/20* (2006.01)
  *H04R 3/00* (2006.01)
  *G05F 1/46* (2006.01)
  *H02M 3/07* (2006.01)

(58) Field of Classification Search
  USPC .................................................. 330/127, 297
  See application file for complete search history.

(56) References Cited

U.S. PATENT DOCUMENTS

| | | |
|---|---|---|
| 2013/0148439 A1 | 6/2013 | Huang et al. |
| 2013/0154732 A1* | 6/2013 | Cowley ................ H03F 1/0211 330/127 |
| 2014/0169588 A1 | 6/2014 | Petersen |
| 2015/0091644 A1 | 4/2015 | Li et al. |
| 2016/0109932 A1 | 4/2016 | Jeon |

FOREIGN PATENT DOCUMENTS

| | | |
|---|---|---|
| CN | 102299620 A | 12/2011 |
| CN | 202206350 U | 4/2012 |
| CN | 102545568 A | 7/2012 |
| CN | 203435076 U | 2/2014 |
| CN | 104518743 A | 4/2015 |
| CN | 104754484 A | 7/2015 |
| CN | 105528051 A | 4/2016 |
| CN | 105955439 A | 9/2016 |
| EP | 2744103 A1 | 6/2014 |
| EP | 2840694 A1 | 2/2015 |

OTHER PUBLICATIONS

Neri, F. et al., "Reconfigurable Audio Output Stage in 45NM Process for Single Speaker Mobile Application," IEEE EUROCON 2009, May 18-23, 2009, pp. 1214-1218.

* cited by examiner

POWER SUPPLY CIRCUIT AND AUDIO PLAY DEVICE

CROSS-REFERENCE TO RELATED APPLICATIONS

This application is a National Stage of International Application No. PCT/CN2017/076191, filed on Mar. 9, 2017, which claims priority to Chinese Patent Application No. 201611048663.6, filed on Nov. 22, 2016. Both of the aforementioned applications are hereby incorporated by reference in their entireties.

TECHNICAL FIELD

This application relates to the field of circuit control, and in particular, to a power supply circuit and an audio play device.

BACKGROUND

To implement high-fidelity (High-Fidelity, Hi-Fi) sound quality in a portable device, that is, to play a replayed sound that resembles to an original sound, the portable device usually needs a lossless sound source, a high-performance audio coder/decoder (coder/decoder, Codec), a DAC (digital-to-analog converter), a power amplifier (Power Amplifier, PA), and a high-quality headset (or a related play device such as a receiver, a sound box, or a speaker).

Figure 1:
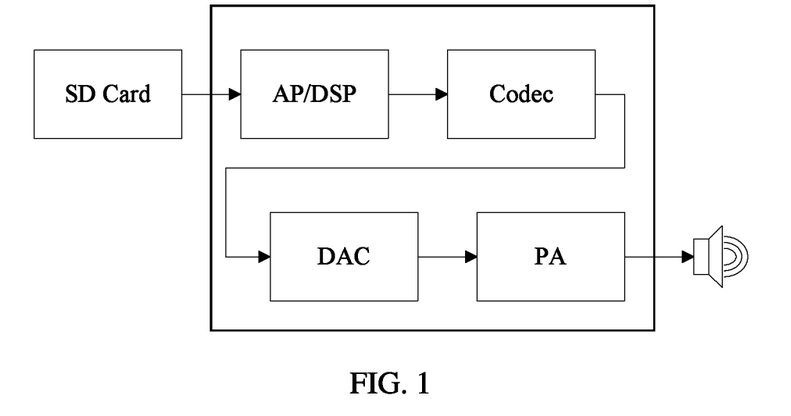
FIG. 1 is a schematic diagram of a system architecture of an audio play device according to an embodiment of the present invention.

Currently, a hi-fi mobile phone mainly means that the mobile phone has a high-performance audio codec and some DACs and PAs to play music. A diagram of a system architecture of the hi-fi mobile phone is shown in FIG. 1. An application processor (Application Processor, AP) or a digital signal processor (Digital Signal Processor, DSP) reads stored audio data that is in an MP3 format (or in another storage format), and transmits the audio data to the audio codec for decoding. A decoded signal is transmitted to the DAC, and the DAC converts the digital signal into an analog signal that can be identified by a human ear, and then the PA drives a speaker to play the analog signal.

In the foregoing process, in a process of converting the digital signal into the analog signal by using the DAC, amplifying the analog signal by using the PA, and driving a device such as a headset or a sound box to play the analog signal, whether distortion occurs is a key factor for obtaining hi-fi sound quality. The DAC is a sensitive circuit, and is extremely susceptible to interference. Therefore, if a same power supply circuit is used to supply power to the DAC and the PA, noise crosstalk generated when the PA drives the speaker is transmitted to the DAC by using the power supply circuit, and consequently the analog signal output by the DAC is distorted, and sound quality is damaged. Generally, the DAC and the PA are separately provided with a power supply circuit, to prevent the DAC from being affected by crosstalk, so as to resolve the foregoing problem. In consideration of obtained sound quality and power efficiency, an H-type power amplifier principle is usually used to supply power to the DAC and the PA. However, if two H-type power amplifier circuits are separately used to supply power to the DAC and the PA, chip interior and exterior designs become more difficult because of costs, and component costs increase.

Therefore, how to ensure hi-fi sound quality while taking power efficiency and design costs into consideration is a difficult problem that troubles an audio play device designer.

SUMMARY

This application provides a power supply circuit and an audio play device, so as to supply power to a DAC and a PA in the audio play device, and ensure sound quality while taking both power use efficiency and costs into consideration.

According to a first aspect, this application provides a power supply circuit, configured to supply power to a DAC and a PA in an audio play device. The circuit includes a power conversion circuit, a voltage selection circuit, and a voltage regulator.

One end of the voltage regulator is connected to the DAC, the other end is connected to the voltage selection circuit, and the voltage regulator is configured to output a stable voltage to supply power to the DAC.

One end of the power conversion circuit is connected to the PA, the other end is connected to a first power supply, and the power conversion circuit is configured to convert, based on output power of the PA, a voltage of the first power supply into an output voltage that can provide the output power, to supply power to the PA.

A first input end of the voltage selection circuit is connected to a second power supply, a second input end of the voltage selection circuit is connected to an output end of the power conversion circuit, an output end of the voltage selection circuit is connected to the voltage regulator, and the voltage selection circuit is configured to select, based on an output voltage of the power conversion circuit, a working voltage required by the DAC, and a difference between an input voltage and an output voltage of the voltage regulator, the second power supply or the power conversion circuit to supply power to the voltage regulator.

With reference to the first aspect, in a first possible implementation of the first aspect, the voltage selection circuit is specifically configured to: when the output voltage of the power conversion circuit is within a first preset range, select the power conversion circuit to supply power to the voltage regulator; or when the output voltage of the power conversion circuit is within a second preset range, select the second power supply to supply power to the voltage regulator. The first preset range and the second preset range are determined based on the working voltage required by the DAC and the difference between the input voltage and the output voltage of the voltage regulator.

With reference to the first aspect, in a second possible implementation of the first aspect, the voltage selection circuit includes a voltage comparator, a first switch circuit, and a second switch circuit. The first switch circuit is connected to a location between an inverting input end of the voltage comparator and an input end of the voltage regulator. The second switch circuit is connected to a location between the second power supply and the voltage regulator. A non-inverting input end of the voltage comparator is configured to receive a specified voltage threshold, and the voltage threshold is determined based on the working voltage required by the DAC and the difference between the input voltage and the output voltage of the voltage regulator. The inverting input end of the voltage comparator is connected to the power conversion circuit, and an output end of the voltage comparator is separately connected to a control end of the first switch circuit and a control end of the second switch circuit.

When an output level of the voltage comparator is high, the first switch circuit is opened, or when an output level of the voltage comparator is low, the first switch circuit is closed.

When an output level of the voltage comparator is high, the second switch circuit is closed, or when an output level of the voltage comparator is low, the first switch circuit is opened.

With reference to the first aspect, in a third possible implementation of the first aspect, the power conversion circuit includes a BUCK and a CP. One end of the BUCK is connected to the first power supply, and the other end is connected to the CP and the PA. One end of the CP is connected to the BUCK, and the other end is connected to the PA.

With reference to the first aspect, in a fourth possible implementation of the first aspect, the voltage regulator is a low dropout regulator LDO.

With reference to the first aspect, in a fifth possible implementation of the first aspect, the first power supply and the second power supply may be a same power supply, so as to simplify a circuit.

In the foregoing embodiment, when the voltage selection circuit selects the power conversion circuit to supply power to the voltage regulator and then the voltage regulator supplies power to the DAC, because the voltage regulator is used, noise crosstalk generated when the PA drives a speaker is not transmitted to the DAC by using the power supply circuit, thereby ensuring that output audio has relatively high sound quality. Because the power conversion circuit can output a corresponding voltage based on the output power of the PA, when the power conversion circuit supplies power to the DAC and the PA, power use efficiency can be ensured, and power consumption of the audio play device can be reduced. In addition, because the power conversion circuit outputs the corresponding voltage based on the output power of the PA, if only the power conversion circuit is used to supply power to the voltage regulator and then the voltage regulator supplies power to the DAC, it is possible that a voltage output by the power conversion circuit is insufficient to supply power to the DAC. In the foregoing embodiment, if this case occurs, the voltage selection circuit may select the second power supply to supply power to the voltage regulator and then the voltage regulator supplies power to the DAC. Therefore, in the foregoing embodiment of the present invention, the DAC and the PA can be powered, and relatively high sound quality can be ensured while both power efficiency and costs are considered.

According to a second aspect, this application provides a power supply circuit, configured to supply power to a DAC and a PA in an audio play device. The power supply circuit includes a power conversion circuit and a voltage regulator. One end of the voltage regulator is connected to the DAC, the other end is connected to the power conversion circuit, and the voltage regulator is configured to output a stable voltage to supply power to the DAC.

One end of the power conversion circuit is connected to the PA and the voltage regulator, the other end is connected to a power supply, and the power conversion circuit is configured to convert, based on output power of the PA, a voltage of the power supply into an output voltage that can provide the output power, to supply power to the PA and the voltage regulator.

With reference to the second aspect, in a first possible implementation of the second aspect, the power conversion circuit includes a BUCK and a CP. One end of the BUCK is connected to the power supply, and the other end is connected to the CP and the PA. One end of the CP is connected to the BUCK, and the other end is connected to the PA.

With reference to the second aspect, in a second possible implementation of the second aspect, the voltage regulator is a low dropout regulator LDO.

When a minimum value that is of the output voltage and that is adjusted by the power conversion circuit based on the output power of the PA can still be used to supply power to the voltage regulator and can enable the voltage regulator to normally supply power to the DAC, the power supply circuit provided in the foregoing embodiment may be used to supply power to the DAC and the PA, so as to ensure relatively high sound quality while taking both power efficiency and design costs into consideration.

According to a third aspect, this application provides an audio play device, including a DAC, a PA, and any power supply circuit in the first aspect or the second aspect, so as to supply power to the DAC and the PA, and ensure relatively high sound quality while taking both power use efficiency and costs into consideration.

DETAILED DESCRIPTION OF ILLUSTRATIVE EMBODIMENTS

To make the objectives, technical solutions, and advantages of this application clearer, the following further describes this application in detail with reference to the accompanying drawings.

Figure 2:
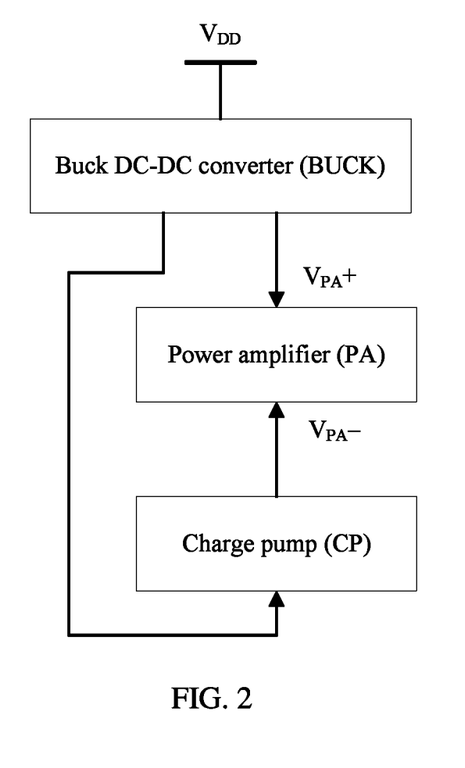
FIG. 2 is a schematic diagram of an H-type power amplifier according to an embodiment of the present invention.

In the prior art, an H-type power amplifier is usually used to ensure that an audio play device outputs audio with relatively high sound quality, while taking power efficiency into consideration. A schematic structural diagram of the H-type power amplifier is shown in FIG. 2, and the H-type power amplifier includes a PA, a buck DC-DC converter (BUCK), and a charge pump (CP). The BUCK is also referred to as a series switching regulator or a switching buck regulator, and is configured to reduce a source voltage (VDD) that is input, so as to output drive load. The CP is also referred to as a switched-capacitor voltage converter, and is a DC-DC converter that stores energy by using a capacitor (instead of an inductor or a transformer). The CP can control charging and discharging of a fast capacitor in a specific manner, so that an output voltage is multiplied or reduced by a specific factor to obtain a required output voltage. A modulation process can ensure up to 80% efficiency. The BUCK and the CP are used to supply power to the PA, so that output audio has little distortion and relatively high sound quality, and relatively high power use efficiency is ensured.

A principle of the foregoing H-type power amplifier is used to supply power to a DAC and the PA, so that power efficiency can be improved, especially for a portable audio play device (such as a mobile phone). Therefore, a user does not need to frequently charge the device, thereby improving user experience. However, crosstalk generated when the PA drives a speaker is transmitted to the DAC by using a power supply circuit. Therefore, to obtain relatively high sound quality, the DAC and the PA cannot directly share one power supply circuit. If two H-type power amplifier power supply circuits are used to separately supply power to the DAC and the PA, costs certainly increase, and chip design and arrangement become more difficult because of the two H-type power supply circuits.

Therefore, embodiments of the present invention provide a power supply circuit and an audio play device, to supply power to a DAC and a PA while taking power use efficiency and design costs into consideration.

Figure 3:
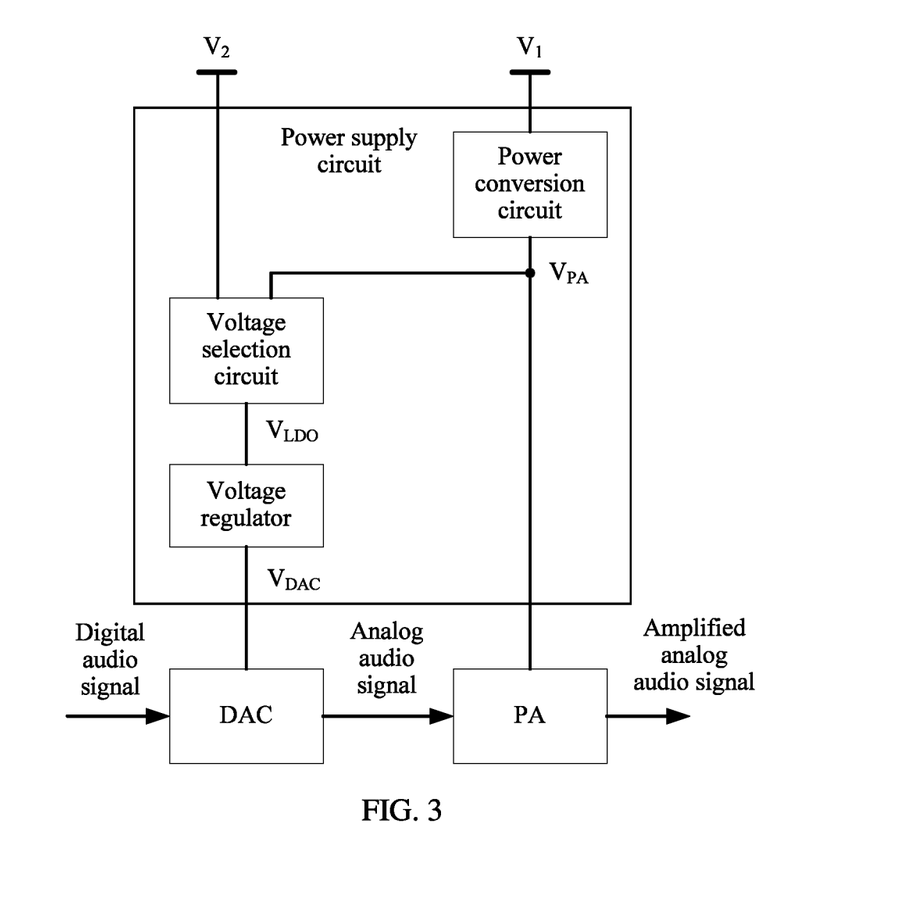
FIG. 3 is a first schematic structural diagram of a power supply circuit according to an embodiment of the present invention.

Referring to FIG. 3, FIG. 3 shows a power supply circuit according to an embodiment of the present invention, and the power supply circuit is configured to supply power to a DAC and a PA in an audio play device. As shown in FIG. 3, the power supply circuit includes a power conversion circuit 301, a voltage selection circuit, and a voltage regulator.

One end of the voltage regulator is connected to the DAC, and the other end is connected to an output end of the voltage selection circuit. The voltage regulator is configured to output a stable voltage (VDAC) to supply power to the DAC. The voltage regulator is a circuit or a device that still outputs a constant voltage when an input voltage, load, an ambient temperature, or a circuit parameter changes, and can provide a stable DC power, and therefore is widely used on various electronic devices. Because the voltage regulator is used, even if crosstalk is generated when the PA drives a speaker, the voltage regulator can still output a stable voltage, so that output signal distortion due to crosstalk caused on the DAC can be avoided, thereby ensuring that audio output by the audio device has a relatively high sound quality.

One end of the power conversion circuit is connected to the PA, and the other end is connected to a first power supply (V1). The power conversion circuit is configured to convert, based on output power of the PA, a voltage of the first power supply into a corresponding voltage (VPA) that can provide power required by the PA, and output the voltage to the PA. Generally, if the output power of the PA is higher, correspondingly, a higher input voltage is required to supply power to the PA, and in this case, the power conversion circuit adjusts an output voltage, and a higher output voltage is used to supply power to the PA. If the output power of PA is lower, correspondingly, only a lower input voltage is required to supply power to the PA, and in this case, the power conversion circuit adjusts the output voltage, and a lower output voltage is used to supply power to the PA. Therefore, the power conversion circuit may perform adjustment based on a voltage required by the PA, and output a corresponding voltage. This can effectively improve power use efficiency.

A first input end of the voltage selection circuit is connected to a second power supply (V2), and a second input end of the voltage selection circuit is connected to an output end of the power conversion circuit. An output end of the voltage selection circuit is connected to the voltage regulator, and an output voltage of the voltage selection circuit is denoted as VLDO. The voltage selection circuit is configured to select, based on an output voltage VPA of the power conversion circuit, a working voltage VDAC required by the DAC, and a difference between an input voltage and an output voltage of the voltage regulator, the second power supply or the power conversion circuit to supply power to the voltage regulator. If the power conversion circuit is used to supply power to the voltage regulator, because the power conversion circuit can adjust the output voltage of the power conversion circuit based on the output power of the PA, power use efficiency can be improved. However, because the output voltage of the power conversion circuit varies with the output power of the PA, it is possible that a voltage output by the power conversion circuit cannot be used to supply power to the voltage regulator, and consequently the voltage regulator cannot output the working voltage VDAC required by the DAC. When this case occurs, the voltage selection circuit may select the second power supply V2 to supply power to the voltage regulator and then the voltage regulator supplies power to the DAC. The voltage selection circuit may further monitor the output voltage of the power conversion circuit. When the output voltage of the power conversion circuit can be used to supply power to the voltage regulator and can enable the voltage regulator to output the voltage VDAC required by the DAC, the voltage selection circuit selects the power conversion circuit to supply power to the voltage regulator. A voltage of the second power supply V2 is greater than the output voltage of the power conversion circuit. The voltage regulator outputs a stable and fixed voltage. When the power conversion circuit is used to supply power to the voltage regulator, the difference between the input voltage and the output voltage of the voltage regulator is smaller. This improves power conversion efficiency.

In a possible implementation, the voltage selection circuit is specifically configured to: when the output voltage of the power conversion circuit is within a first preset range, select the power conversion circuit to supply power to the voltage regulator; or when the output voltage of the power conversion circuit is within a second preset range, select the second power supply to supply power to the voltage regulator. The first preset range and the second preset range are determined based on the working voltage required by the DAC and the difference between the input voltage and the output voltage of the voltage regulator.

Figure 4:
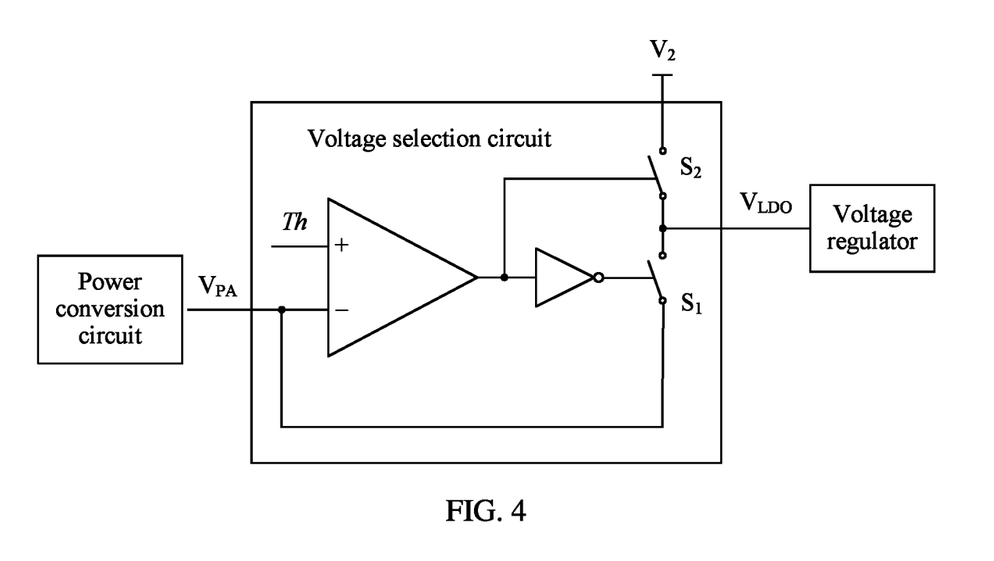
FIG. 4 is a schematic structural diagram of a voltage selection circuit according to an embodiment of the present invention.

As shown in FIG. 4, in a possible implementation, the voltage selection circuit includes a voltage comparator, a first switch circuit, and a second switch circuit. The first switch circuit includes a first switch S1 and an inverter that are connected to a location between an inverting input end of the voltage comparator and an input end of the voltage regulator, and the second switch circuit includes a second switch S2 that is connected to a location between the second power supply V2 and the input end of the voltage regulator. A non-inverting input end of the voltage comparator is configured to receive a specified voltage threshold Th, and the voltage threshold Th is determined based on the working voltage required by the DAC and the difference between the input voltage and the output voltage of the voltage regulator. The inverting input end of the voltage comparator is connected to the output end of the power conversion circuit. An output end of the voltage comparator is separately connected to a control end of the first switch circuit and a control end of the second switch circuit, to be specific, the output end of the voltage comparator is connected to a control end of the first switch S1 by using the inverter, and the output end of the voltage comparator is connected to a control end of the second switch S2. Both the first switch S1 and the second switch S2 are closed when input levels of the control ends are high, and are opened when the input levels of the control ends are low. Therefore, when an output level of the voltage comparator is high, the first switch circuit is opened and the second switch circuit is closed, and therefore the second power supply supplies power to the voltage regulator. When an output level of the voltage comparator is low, the first switch circuit is closed and the first switch circuit is opened, and therefore the power conversion circuit supplies power to the voltage regulator.

Certainly, the first switch circuit and the second switch circuit may be a circuit other than the circuit shown in FIG. 4, so that when the output voltage of the power conversion circuit is greater than the specified voltage threshold, the power conversion circuit supplies power to the voltage regulator, or when the output voltage of the power conversion circuit is less than the specified voltage threshold, the second power supply supplies power to the voltage regulator.

Figure 5:
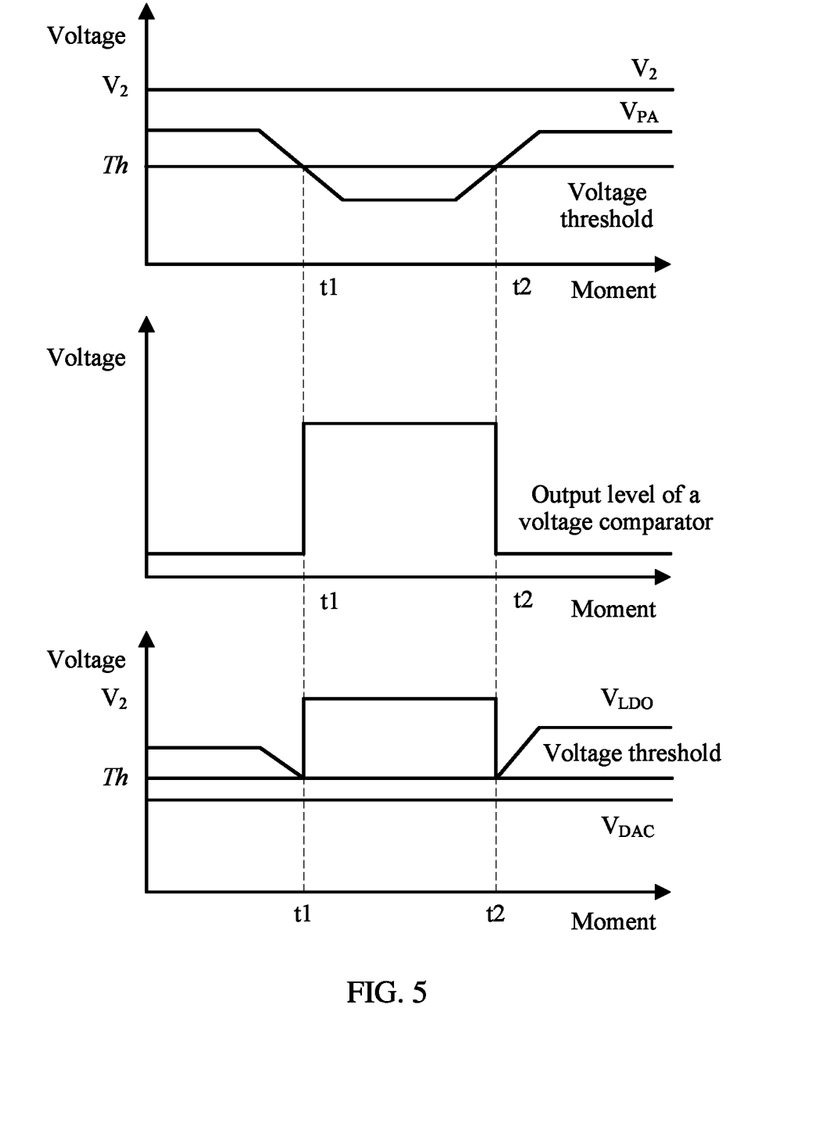
FIG. 5 is a first time sequence diagram of a voltage selection circuit according to an embodiment of the present invention.

FIG. 5 is a time sequence diagram of the circuit shown in FIG. 4. At moments 0 to t1, the output voltage (VPA) of the power conversion circuit is greater than the specified voltage threshold Th, that is, the power conversion circuit can supply power to the voltage regulator and can enable the voltage regulator to output the voltage required by the DAC. In this case, a voltage value of the inverting input end of the voltage comparator is greater than a voltage value of the non-inverting input, and the output level of the voltage comparator is low. When the output level of the voltage comparator is low, the second switch S1 is opened, and the first switch is closed. Because the first switch is closed, the power conversion circuit supplies power to the voltage regulator. In this case, the output voltage (VLDO) of the voltage selection circuit is the same as the VPA. The power conversion circuit is used to supply power to the voltage regulator, so that power use efficiency can be effectively improved. At moments t1 to t2, the VPA is less than the specified voltage threshold, that is, the power conversion circuit cannot supply power to the voltage regulator and cannot enable the voltage regulator to output the supply voltage required by the DAC. In this case, the voltage value of the inverting input end of the voltage comparator is less than the voltage value of the non-inverting input, and the output level of the voltage comparator is high. When the output level of the voltage comparator is high, the second switch circuit is closed and the first switch circuit is opened, and therefore the V2 supplies power to the voltage regulator. Therefore, the VLDO is the same as the V2. After the moment t2, the VPA is greater than the specified voltage threshold again, that is, the voltage value of the inverting input end of the voltage comparator is greater than the voltage value of the non-inverting input, and the output level of the voltage comparator is low. When the output level of the voltage comparator is low, the second switch is opened and the first switch is closed, and therefore the power conversion circuit supplies power to the voltage regulator. Therefore, the VLDO is the same as the VPA.

Figure 6:
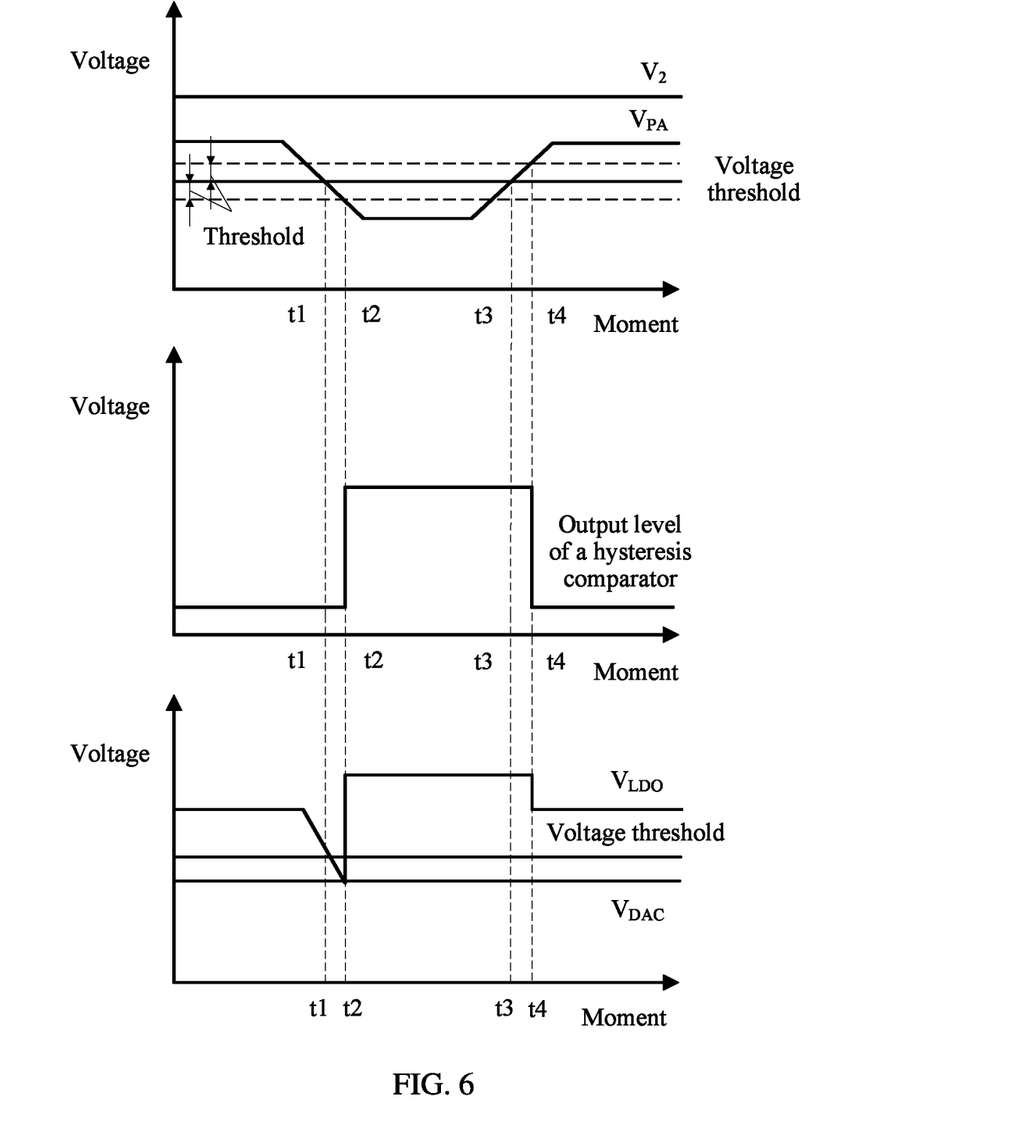
FIG. 6 is a second time sequence diagram of a voltage selection circuit according to an embodiment of the present invention.

In another possible implementation, the voltage comparator in FIG. 4 may be replaced with a hysteresis comparator (Hysteresis Comparator). Compared with the voltage comparator, the hysteresis comparator has anti-interference performance. This is because when interference to a transitional voltage value does not exceed a threshold, a value of an output voltage of the hysteresis comparator is stable. FIG. 6 is a time sequence diagram obtained after the voltage comparator is replaced with the hysteresis comparator. At moments t1 to t2, although the output voltage (VPA) of the power conversion circuit is less than the specified voltage threshold, a difference between the VPA and the voltage threshold is less than the threshold. Therefore, an output level of the hysteresis comparator is still low, and the voltage selection circuit still selects the power conversion circuit to supply power to the voltage regulator. In this case, the output voltage (VLDO) of the voltage selection circuit is the same as the output voltage (VPA) of the power conversion circuit. At moments t2 to t3, the difference between the VPA and the specified voltage threshold is greater than the threshold. Therefore, the output level of the hysteresis comparator is high, and the voltage selection circuit selects the second power supply (V2) to supply power to the voltage regulator. In this case, the VLDO is the same as the V2. At moments t3 to t4, although the VPA is greater than the specified voltage threshold, the difference between the VPA and the specified voltage threshold is less than the threshold. Therefore, the output level of the hysteresis comparator is still high, and the voltage selection circuit still selects the second power supply to supply power to the voltage regulator. In this case, the VLDO is the same as the V2. After a moment t4, the difference between the VPA and the specified voltage threshold is greater than the threshold. Therefore, the output level of the hysteresis comparator is low, and the voltage selection circuit selects the power conversion circuit to supply power to the voltage regulator. In this case, the VLDO is the same as the VPA.

The voltage selection circuit shown in FIG. 4 is merely a specific embodiment. Certainly, the voltage selection circuit may be a circuit other than the circuit shown in FIG. 4. For example, the voltage threshold is connected to the inverting input end of the voltage comparator, the output end of the power conversion circuit is connected to the non-inverting input end of the voltage comparator, the control end of the first switch is connected to the output end of the voltage comparator, and the control end of the second switch is connected to the output end of the voltage comparator by using the inverter. For another example, one single-pole double-throw switch may be used to replace the first switch and the second switch.

In a possible implementation, the power conversion circuit may include a BUCK and a CP, and a schematic diagram of a connection between the BUCK and the CP may be shown in FIG. 2. One end of the BUCK is connected to the first power supply, and the other end is connected to the CP and the PA. Certainly, the power conversion circuit may be another power supply circuit that uses an H-type power amplifier principle, or may be another type of power supply circuit for which both sound quality and power use efficiency can be considered.

Figure 7:
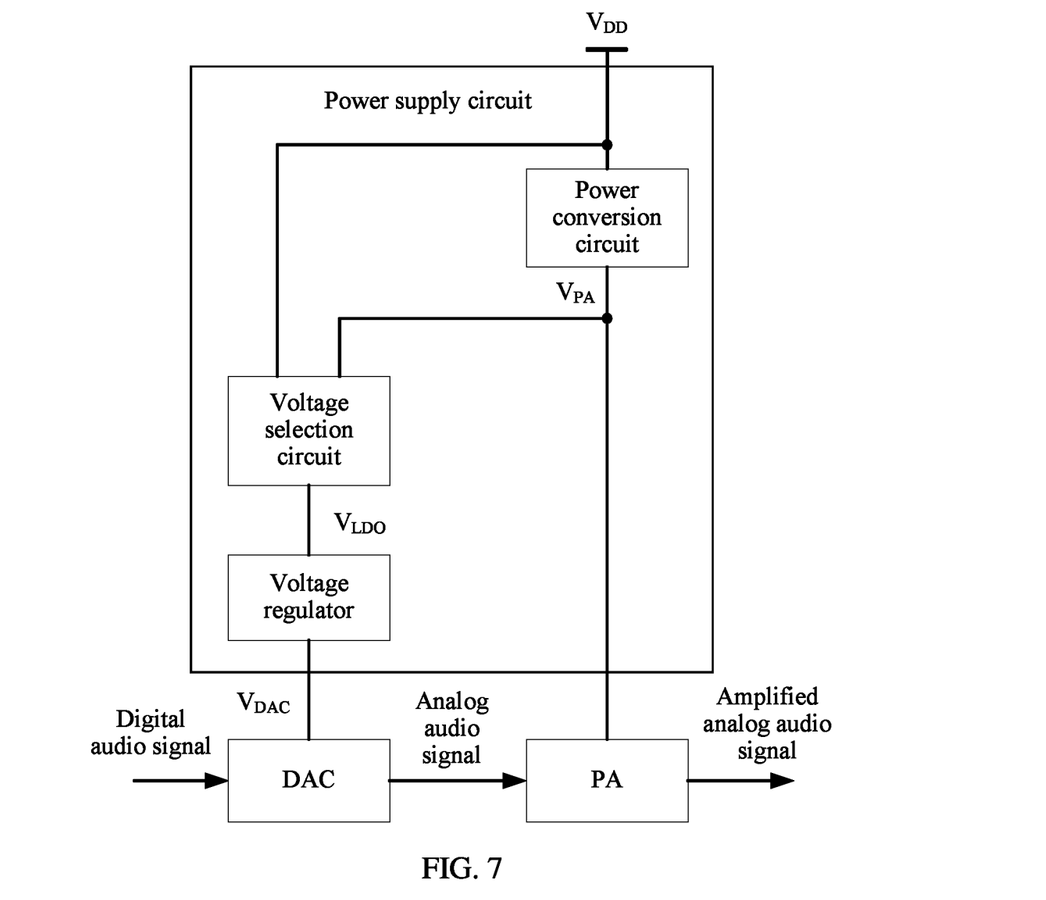
FIG. 7 is a second schematic structural diagram of a power supply circuit according to an embodiment of the present invention.

In a possible implementation, the first power supply and the second power supply may be a same power supply. As shown in FIG. 7, the input end of the power conversion circuit is connected to a power supply VDD, the first input end of the voltage selection circuit is also connected to the power supply VDD, and the second input end of the voltage selection circuit is still connected to the output end of the power conversion circuit. In the foregoing embodiment, a circuit and a chip design can be simplified.

In a possible implementation, the voltage regulator may be a low dropout regulator (Low Dropout Regulator, LDO). A conventional linear regulator, such as a 78xx series chip, requires that an input voltage needs to be higher than an output voltage by 2 V to 3 V. If the input voltage is not higher than the output voltage by 2 V to 3 V, the conventional linear regulator cannot normally work. However, in some cases, an input voltage is 5 V, but a required output voltage is 3.3 V, and a difference between the input voltage and the output voltage is merely 1.7 V. In this case, the LDO may be used for implementation. The LDO is used, so that a supply voltage that needs to be provided for the LDO to ensure normal working of the DAC is minimized, in other words, the foregoing voltage threshold is minimized, so that the power conversion circuit is more frequently used to supply power to the voltage regulator, thereby improving power use efficiency.

In addition, an embodiment of the present invention further provides a power supply circuit, configured to supply power to the DAC and the PA when a minimum value that is of the output voltage and that is adjusted by the power conversion circuit based on the output power of the PA can still be used to supply power to the voltage regulator and can enable the voltage regulator to normally supply power to the DAC, so as to further simplify a circuit structure.

Figure 8:
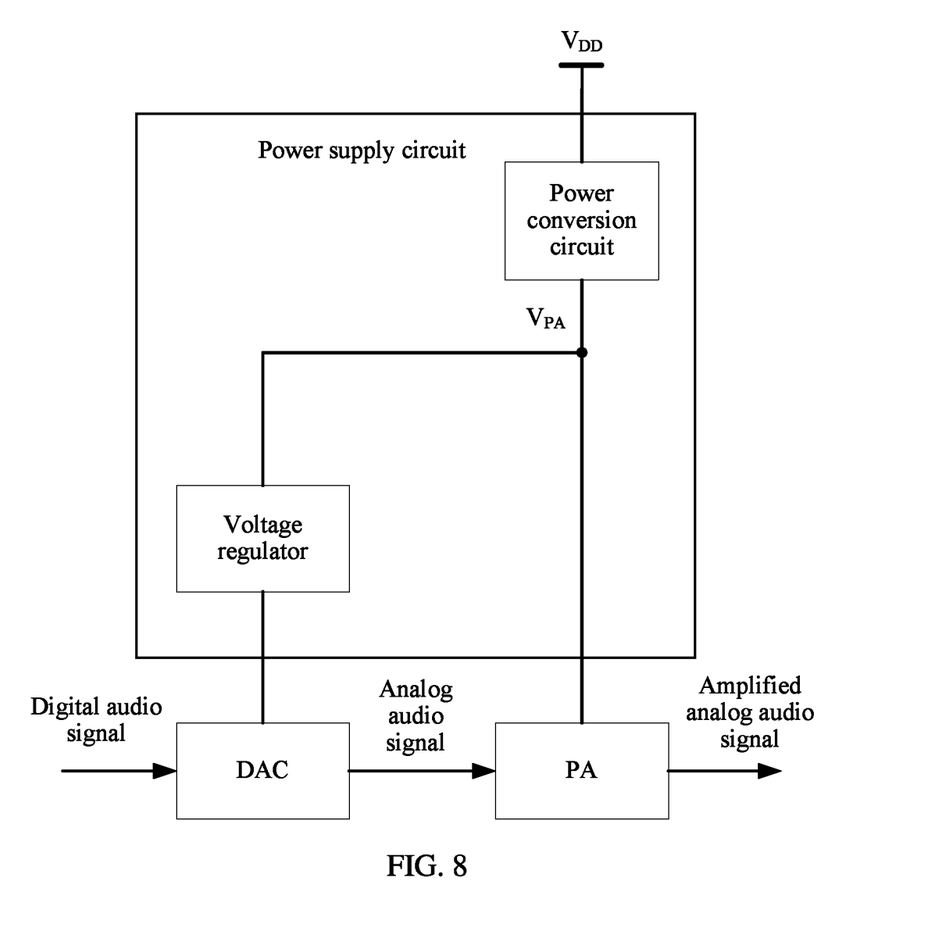
FIG. 8 is a third schematic structural diagram of a power supply circuit according to an embodiment of the present invention.

Referring to FIG. 8, FIG. 8 is a schematic structural diagram of another power supply circuit according to an embodiment of the present invention. As shown in the diagram, the power supply circuit includes a power conversion circuit and a voltage regulator.

One end of the voltage regulator is connected to a DAC, the other end is connected to the power conversion circuit, and the voltage regulator is configured to output a stable voltage to supply power to the DAC.

One end of the power conversion circuit is connected to a PA and the voltage regulator, the other end is connected to a power supply VDD, and the power conversion circuit is configured to convert, based on output power of the PA, a voltage of the power supply into an output voltage that can provide the output power, to supply power to the PA and the voltage regulator.

In a possible implementation, the power conversion circuit includes a BUCK and a CP. One end of the BUCK is connected to the power supply, and the other end is separately connected to the CP and the PA. One end of the CP is connected to the BUCK, and the other end is connected to the PA.

In a possible implementation, the voltage regulator is an LDO.

Based on a same technical concept, an embodiment of the present invention further provides an audio play device, including a DAC, a PA, and any power supply circuit described above, so as to supply power to the DAC and the PA and ensure relatively high sound quality while taking both power efficiency and costs into consideration.

Obviously, a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A power supply circuit, comprising:
   a power conversion circuit;
   a voltage selection circuit; and
   a voltage regulator, wherein the voltage regulator is coupled to the voltage selection circuit and a digital-to-analog converter (DAC) of an electronic device, and the voltage regulator is configured to provide supply power to the DAC;
   wherein the power conversion circuit is coupled to a first power supply and a power amplifier (PA) of the electronic device, and the power conversion circuit is configured to convert, based on output power of the PA, a voltage of the first power supply into an output voltage that supplies power to the PA; and
   wherein the voltage selection circuit is coupled to a second power supply, the power conversion circuit and the voltage regulator, wherein the voltage selection circuit is configured to select the second power supply or the power conversion circuit to supply power to the voltage regulator, and wherein the second power supply or the power conversion circuit is selected based on an output voltage of the power conversion circuit, a working voltage required by the DAC, and a difference between an input voltage and an output voltage of the voltage regulator.

2. The circuit of claim 1, wherein the voltage selection circuit is configured to:
   select the power conversion circuit to supply power to the voltage regulator when the output voltage of the power conversion circuit is within a first preset range; and
   select the second power supply to supply power to the voltage regulator when the output voltage of the power conversion circuit is within a second preset range;
   wherein the first preset range and the second preset range are determined based on the working voltage required by the DAC and the difference between the input voltage and the output voltage of the voltage regulator.

3. The circuit of claim 1, wherein the voltage selection circuit comprises:
   a voltage comparator;
   a first switch circuit, wherein the first switch circuit is connected to a location between an inverting input end of the voltage comparator and an input end of the voltage regulator; and
   a second switch circuit, wherein the second switch circuit is connected to a location between the second power supply and the input end of the voltage regulator;
   wherein a non-inverting input end of the voltage comparator is configured to receive a voltage threshold, the inverting input end of the voltage comparator is connected to the power conversion circuit, and an output end of the voltage comparator is separately connected to a control end of the first switch circuit and a control end of the second switch circuit; and
   wherein:
      the first switch circuit configured in a manner that when an output level of the voltage comparator is low, the first switch circuit is closed, causing the power conversion circuit to supply power to the voltage regulator; or
      the second switch circuit is configured in a manner that when an output level of the voltage comparator is high, the second switch circuit is closed, causing the second power supply to supply power to the voltage regulator.

4. The circuit of claim 3, wherein the first switch circuit configured in a manner that when an output level of the voltage comparator is low, the first switch circuit is closed, causing the power conversion circuit to supply power to the voltage regulator.

5. The circuit of claim 3, wherein the second switch circuit is configured in a manner that when an output level of the voltage comparator is high, the second switch circuit is closed, causing the second power supply to supply power to the voltage regulator.

6. The circuit of claim 1, wherein the power conversion circuit comprises:
a buck DC-to-DC converter (BUCK); and
a charge pump (CP);
wherein the BUCK is coupled to the first power supply, the CP and the PA; and
wherein the CP is coupled to the PA.

7. The circuit of claim 1, wherein the voltage regulator is a low dropout regulator (LDO).

8. The circuit of claim 1, wherein the first power supply and the second power supply are a same power supply.

9. The circuit of claim 1, wherein the first power supply and the second power supply are different power supplies.

10. A power supply circuit, comprising:
a power conversion circuit; and
a voltage regulator;
wherein the voltage regulator is coupled to a digital-to-analog converter (DAC) of an electronic device and the power conversion circuit, and the voltage regulator is configured to provide supply power to the DAC; and
wherein the power conversion circuit is coupled to a power amplifier (PA) of the electronic device, the voltage regulator, and a power supply, and the power conversion circuit is configured to convert, based on output power of the PA, a voltage of the power supply into an output voltage that supplies power to the PA and the voltage regulator.

11. The circuit according to claim 10, wherein the voltage regulator is a low dropout regulator (LDO).

12. The circuit according to claim 10, wherein the DAC is coupled to the PA.

13. An audio play device, comprising:
a digital-to-analog converter (DAC);
a power amplifier (PA); and
a power supply circuit comprising a power conversion circuit, a voltage selection circuit, and a voltage regulator;
wherein the voltage regulator is coupled to the voltage selection circuit and the DAC, and the voltage regulator is configured to provide supply power to the DAC;
wherein the power conversion circuit is coupled to a first power supply and the PA, and the power conversion circuit is configured to convert, based on output power of the PA, a voltage of the first power supply into an output voltage that supplies power to the PA; and
wherein the voltage selection circuit is coupled to a second power supply, the power conversion circuit and the voltage regulator, wherein the voltage selection circuit is configured to select the second power supply or the power conversion circuit to supply power to the voltage regulator, and wherein the second power supply or the power conversion circuit is selected based on an output voltage of the power conversion circuit, a work-ing voltage required by the DAC, and a difference between an input voltage and an output voltage of the voltage regulator.

14. The audio play device of claim 13, wherein the voltage selection circuit is configured to:
select the power conversion circuit to supply power to the voltage regulator when the output voltage of the power conversion circuit is within a first preset range; and
select the second power supply to supply power to the voltage regulator when the output voltage of the power conversion circuit is within a second preset range;
wherein the first preset range and the second preset range are determined based on the working voltage required by the DAC, and the difference between the input voltage and the output voltage of the voltage regulator.

15. The audio play device of claim 13, wherein the voltage selection circuit comprises:
a voltage comparator;
a first switch circuit, wherein the first switch circuit is connected to a location between an inverting input end of the voltage comparator and an input end of the voltage regulator; and
a second switch circuit, wherein the second switch circuit is connected to a location between the second power supply and the input end of the voltage regulator;
wherein a non-inverting input end of the voltage comparator is configured to receive a voltage threshold, the inverting input end of the voltage comparator is connected to the power conversion circuit, and an output end of the voltage comparator is separately connected to a control end of the first switch circuit and a control end of the second switch circuit; and
wherein:
the first switch circuit is configured in a manner that when an output level of the voltage comparator is low, the first switch circuit is closed, causing the power conversion circuit to supply power to the voltage regulator; or
the second switch circuit is configured in a manner that, when an output level of the voltage comparator is high, the second switch circuit is closed, causing the second power supply to supply power to the voltage regulator.

16. The audio play device of claim 13, wherein the power conversion circuit comprises:
a buck DC-to-DC converter (BUCK); and
a charge pump (CP);
wherein the BUCK is coupled to the first power supply, the CP and the PA; and
wherein the CP is coupled to the PA.

17. The audio play device of claim 13, wherein the voltage regulator is a low dropout regulator (LDO).

18. The audio play device of claim 13, wherein the first power supply and the second power supply are a same power supply.

* * * * *